ns Patent [19] [11] 4,192,685
Horike et al. [45] Mar. 11, 1980

[54] PHOTOCURABLE UNSATURATED POLYESTER RESIN COMPOSITION AND CROSS-LINKING AGENTS

[75] Inventors: Akihiro Horike, Hino; Yoshio Itakura, Tokyo; Tadashi Shingu, Hino, all of Japan

[73] Assignee: Teijin Limited, Osaka, Japan

[21] Appl. No.: 874,134

[22] Filed: Feb. 1, 1978

Related U.S. Application Data

[63] Continuation-in-part of Ser. No. 673,809, Apr. 5, 1976, abandoned, which is a continuation of Ser. No. 482,552, Jun. 24, 1974, abandoned.

[30] Foreign Application Priority Data

Jun. 28, 1973 [JP] Japan .................................. 48-72214
Jul. 2, 1973 [JP] Japan .................................. 48-73596

[51] Int. Cl.² .............................................. G03C 1/68
[52] U.S. Cl. ................................... 430/283; 204/159.15; 204/159.16; 430/285; 430/306
[58] Field of Search ...................... 96/115 P, 115 R; 204/159.15, 159.16

[56] References Cited

U.S. PATENT DOCUMENTS

| | | | |
|---|---|---|---|
| 3,628,963 | 12/1971 | Akamatsu et al. | 96/115 R |
| 3,695,877 | 10/1972 | Taneda et al. | 96/35.1 |
| 3,759,807 | 9/1973 | Osborn et al. | 204/159.13 |
| 3,794,494 | 2/1974 | Kai et al. | 96/115 P |
| 3,827,959 | 8/1974 | McGinniss | 204/159.24 |
| 3,827,960 | 8/1974 | McGinniss | 204/159.24 |
| 3,839,171 | 10/1974 | Akamatsu et al. | 204/159.15 |

FOREIGN PATENT DOCUMENTS

| | | | |
|---|---|---|---|
| 48-14173 | 5/1973 | Japan | 96/115 |
| 51-999 | 1/1976 | Japan | 96/115 |
| 1304112 | 1/1973 | United Kingdom . | |

Primary Examiner—Jack P. Brammer
Attorney, Agent, or Firm—Sherman & Shalloway

[57] ABSTRACT

A photosensitive resin composition consisting essentially of an unsaturated polyester, a cross-linking agent and a photosensitizer, said cross-linking agent consisting of a compound having at least one radical-polymerizable double bond within the molecule and a compound expressed by the following formula

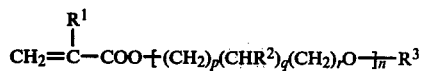

wherein n is an integer of at least 1, p, q, and r is 0 or an integer of at least 1 with the proviso that p+q+r equals to 2-6, $R^1$ is a hydrogen or a methyl group, $R^2$ is a lower alkyl group optionally substituted with a halogen atom, and $R^3$ is an alkyl, aryl or acyl group optionally having a substituent.

14 Claims, No Drawings

PHOTOCURABLE UNSATURATED POLYESTER RESIN COMPOSITION AND CROSS-LINKING AGENTS

This is a continuation-in-part of application Ser. No. 673,809, filed Apr. 5, 1976, which is a continuation of application Ser. No. 482,552, filed June 24, 1974 both now abandoned. Priority under 35 U.S.C. 119 is claimed based upon Japanese patent application No. 72214/48, filed June 28, 1973 and Japanese patent application No. 73596/48, filed July 2, 1973.

This invention relates to a photocurable resin composition, and more specifically, to a photocurable unsaturated polyester resin composition which before curing, is soluble in an aqueous solvent, especially in an alkaline aqueous solution, but becomes insoluble in the solvent upon curing by the action of actinic light. Reliefs for relief printing having excellent quality can be prepared from the resin composition of this invention.

The process of relief printing performed using a printing plate prepared from a lead alloy has long been known in the printing industry, but has been desired to be improved because of the defects of causing a bad working environment and poor workability. In recent years, there has been an advance in the techniques of composition and phototypesetting using a computer, and the demand for photographic plate-making has increased. Usually, a metal such as zinc, or a photocurable resin is used for preparing reliefs for relief printing by the photographic plate-making method, and no other useful method has been known to date.

Since the production of a metal printing plate such as a zinc plate requires an etching step using an acid such as nitric acid, the working environment is bad, and the time required for plate making is long. Moreover, the control of the process is troublesome, and requires skilled workers. To overcome these difficulties, the preparation of relief printing plates using a photocurable resin has become rapidly prevalent in recent years.

These photocurable resins are required first of all to be soluble in aqueous solvents before exposure so that the non-exposed portion of an exposed plate can be washed out with aqueous solvents, and this is more advantageous than the use of organic solvents in respect of economy, working safety and working environment.

After exposure, the cured portion should have sufficient affinity for printing inks and should not be swollen or degenerated by the solvent contained in the ink. Furthermore, it should not be susceptible to changes in temperature and humidity which may cause changes in properties, in view of the need to store the printing plate and maintain the quality of printed matter constant. Furthermore, it is required to have strength and dimensional stability to an extent such as not to cause the blurring and distortion of the printed matter.

Resin compositions comprising an unsaturated polyester, a cross-linking agent and a photosensitizer have previously been known as photocurable resin compositions for use in photographic plate making (for example, Japanese Patent Publication No. 5093/60, and Japanese Patent Publication No. 19125/68). However, these resin compositions have not been entirely satisfactory in regard to cost or the properties required of a printing plate, such as solvent resistance, moisture resistance, flexibility, dimensional stability, strength and toughness.

Recently, Japanese Patent Publication No. 1537/72 proposed photocurable resin compositions having excellent properties which comprise an unsaturated polyester resin composition, an acrylamide-type monomer and a cross-linking agents of the acrylate type.

However, these photocurable unsaturated polyester compositions have been required to be improved further in flexibility and toughness, stability of physical properties against temperature and humidity, and the printability of the highlight portion of photographs.

It has also been desired to provide resin compositions having softness and elasticity which when applied to a support base film, do not cause curling of the support film.

Additional prior art references which have been cited in the parent and grandparent applications are:
U.S. Pat. No. 3,695,877—Taneda, et al.
U.S. Pat. No. 3,759,807—Osborn, et al.
U.S. Pat. No. 3,827,959—McGinniss
U.S. Pat. No. 3,927,960—McGinniss
U.S. Pat. No. 3,839,171—Akamatsu, et al.

This invention relates to a photosensitive resin composition consisting essentially of an unsaturated polyester, a cross-linking agent and a photosensitizer, said cross-linking agent consisting of a compound having at least one radical-polymerizable double bond in the molecule and a compound expressed by the following Formula (1)

wherein n is an integer of at least 1, p, q and r are 0 or integers at least 1 with the proviso that p+q+r equals 2-6, $R^1$ is a hydrogen atom or a methyl group, $R^2$ is a lower alkyl group optionally having substituted a halogen atom, and $R^3$ is an alkyl, aryl or acyl group optionally having a substituent.

The resin composition of this invention has the excellent feature of affording a cured resin having superior properties, especially superior flexibility, as a printing plate, and suffering from little change in properties with changes in temperature and humidity.

The unsaturated polyester used in the resin composition of this invention is prepared by reacting an unsaturated dicarboxylic acid or its ester-forming derivative or a mixture of it with a saturated dicarboxylic acid or its ester-forming derivative as an acid component with a glycol component.

Examples of the glycol components are saturated aliphatic glycols such as ethylene glycol, propylene glycol, trimethylene glycol, tetramethylene glycols, 1,6-hexanediol, diethylene glycol, triethylene glycol, or dipropylene glycol, unsaturated aliphatic glycols such as butenediol, or oligobutadiene having a hydroxyl group at both ends, and aralkyl glycol such as xylylene glycol.

The unsaturated discarboxylic acid or its ester-forming derivatives may, for example, be an unsaturated dicarboxylic acid having at least one ethylenic carbon-to-carbon double bond, such as maleic acid, fumaric acid, itaconic acid, citraconic acid, muconic acid, anhydrides thereof, lower alkyl esters thereof, or acid halides thereof.

For complete photocuring, it is preferred to use the above unsaturated dicarboxylic acid component in an amount of at least 20 mol% based on the total acid component.

Examples of the saturated dicarboxylic acid or its ester-forming derivatives are aliphatic dicarboxylic acids such as succinic acid, adipic acid, azelaic acid or sebacic acid, aromatic dicarboxylic acids such as terephthalic acid, phthalic acid, isophthalic acid or naphthalene dicarboxylic acid, anhydrides of these acids, lower alkyl esters of these acids, and acid halides of these acids.

Conveniently, the unsaturated polyester is prepared by polycondensing the above acid component and the glycol component at a temperature of 100° to 250° C. and at atmospheric pressure. A catalyst may be used in this polycondensation reaction, but the reaction easily proceeds even in the absence of a catalyst, and ends in 2 to 10 hours. In order to render the resulting unsaturated polyester soluble in aqueous solvents, it is preferred to charge the acid component in a manner such that the carboxyl group is excessive to the hydroxyl group, to adjust the acid value of the unsaturated polyester to at least 20. Especially for easy washing with aqueous solvents, it is preferred to adjust the acid value of the unsaturated polyester to at least 50.

The acid value can be controlled as desired according to the degree of polymerization and the ratio of the glycol component to the acid component.

In order to raise the acid value, the unsaturated polyester used in this invention may contain a small amount of polycarboxylic acid containing at least three carboxyl groups, such as trimellitic acid or pyromellitic acid, copolymerized therein.

The new aspect of this invention is that the cross-linking agent for the unsaturated polyester consists of a compound of the following formula

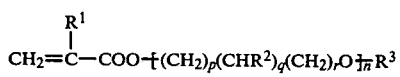

wherein n is an integer of at least 1, preferably 1 to 15, p, q and r and 0 or an integer of at least 1 with the proviso that p+q+r equals to 2-6, $R^1$ is a hydrogen atom or a methyl group, $R^2$ is a lower alkyl group optionally substituted with a halogen atom, and $R^3$ is an alkyl, aryl or acyl group optionally having a substituent;

and a compound having at least one radical-polymerizable carbon-to-carbon double bond in the molecule [excepting those falling within the above formula (1)].

Examples of $R^3$ in the formula (1) are methyl, ethyl, propyl and butyl groups, and halogen-substitution products of these. Examples of the aryl group and substituted aryl groups are phenyl and naphthyl groups, and the halogen-substitution products of these. Examples of the acyl group and substituted acyl group are acetyl, propionyl, butyryl and benzoyl groups, and the halogen-substitution products of these. Saturated acyl and saturated substituted acyl groups are preferred.

Examples of these compounds of formula (1) are methoxy-ethyl methacrylate, methoxyethyl acrylate, ethoxyethyl methacrylate, ethoxyethyl acrylate, butoxyethyl methacrylate, ethoxypropyl methacrylate, diethylene glycol methyl ether methacrylate, diethylene glycol ethyl ether methacrylate, diethylene glycol butyl ether methacrylate, diethylene glycol ethyl ether acrylate, tetramethylene glycol methyl ether methacrylate, tetramethylene glycol methyl ether acrylate, polyethylene glycol alkyl ether methacrylates, polypropylene glycol alkyl ether methacrylates, phenoxyethyl methacrylates, acetate, propionate, butyrate or benzoate of hydroxyethyl methacrylate, acetate, propionate, butyrate or benzoate of hydroxyethyl acrylate, acetate or propionate of hydroxypropyl acrylate, acetate, propionate or butyrate of hydroxybutyl methacrylate, acetate, propionate or butyrate of diethylene glycol monomethacrylate, acetate, propionate or butyrate of polyethylene glycol monomethacrylate, and acetate, propionate or butyrate of 3-chloro-2-hydroxypropyl methacrylate.

These compounds have good compatibility with the unsaturated polyesters, and even after a cross-linking reaction, do not develop turbidity. Therefore, they have the advantage of providing printed matter having sharp reliefs of clear contrast.

Furthermore, when such a compound is incorporated into the unsaturated polyester, the flexibility of the polyester is very much improved, and in particular, the flex rate of the polyester is improved. This feature has the advantage of rendering the printing plate made from it resistant to breakage when printing on a cylinder of small diameter. The amount of the above compound is preferably 0.5 to 40%, more preferably 0.5 to 30%, by weight based on the weight of the entire composition and not more than 80% by weight, preferably 10 to 70% by weight, based on the weight of the entire cross-linking agent. If this amount is less than 0.5% by weight, the effect of improving the flexibility is reduced, and when the amount exceeds the upper limit specified above, the resin tends to be soft.

Compounds having at least one radical-polymerizable carbon-to-carbon double bond within the molecule [other than those covered by formula (1)] are, for example, monomers having high reactivity with the double bonds of unsaturated polyesters, such as styrene, α-methylstyrene, acrylic acid, methacrylic acid, vinyl acetate, vinyl propionate, N-vinyl pyrrolidone, acrylamide, methacrylamide, diacetone acrylamide, N-methylol acrylamide, N-ethylol acrylamide, N-butyrol acrylamide, N-methyl acrylamide, N-isopropyl acrylamide, N-methylol methacrylamide, N-ethylol methacrylamide, N-butyrol methacrylamide, N-methyl methacrylamide, N-isopropyl methacrylamide, and N,N-dimethyl acrylamide, and compounds having at least two double bonds such as diethylene glycol diacrylate, triethylene glycol diacrylate, tetraethylene glycol diacrylate, polyethylene glycol diacrylate, diethylene glycol dimethacrylate, triethylene glycol dimethacrylate, tetraethylene glycol dimethacrylate, polyethylene glycol dimethacrylate, dipropylene glycol dimethacrylate, polypropylene glycol dimethacrylate, trimethylol propane triacrylate, pentaerythritol triacrylate, trimethylol propane trimethacrylate, glycerine trimethacrylate, ethylene glycol bisallyl carbonate, diallyl phthalate, or diallyl adipate. Mixtures of compounds of the acrylamide (or methacrylamide) type and acrylate (or methacrylate) type are especially suitable.

Especially, the use of a compound of formula (1) in combination with an acrylamide or methacrylamide compound of formula (2)

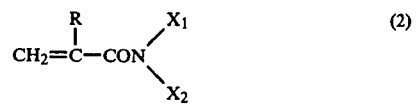

wherein R is a hydrogen atom or an alkyl group, and $X_1$ and $X_2$ are organic groups, and in further combination with an above-exemplified polyacrylate compound and/or polymethacrylate compound, gives rise to excellent physical properties in respect of odor, strength, elongation, and flexibility, and is therefore preferred. In this case, the compound of formula (2) is used in a proportion of preferably 1 to 20% by weight, more preferably 3 to 12% by weight, based on the weight of the entire composition. It is preferred that the cross-linking agent including the compound of the formula (1) above should be used in an amount of 5 to 70% by weight based on the weight of the entire composition.

In the present invention, a photopolymerization initiator is used together with the unsaturated polyester and the cross-linking agent. Examples of the photopolymerization initiator are ketaldonyl compounds such as diacetyl or dibenzyl, α-ketaldonyl alcohols such as benzoin or pivalon, acyloin ethers such as benzoin methyl ether or benzoin ethyl ether, polynuclear quinones such as anthraquinone, Michler's ketones, and benzophenone. The suitable amount of the photo-polymerization initiator is 0.01 to 10% by weight based on the weight of the entire composition. If the amount is less than the lower limit specified above, a curing reaction in the presence of actinic light is delayed. On the other hand, if the amount is larger than the upper limit specified above, the storage stability of the resin composition is reduced.

In order to enhance the storage stability of the resin composition of this invention, a known heat polymerization initiator may be incorporated. Examples of the polymerization inhibitor are phenols, hydroquinones, catechols, or picric acids. These inhibitors are used generally in an amount of 0.0001 to 5% by weight based on the entire composition.

Conveniently, an original printing plate is prepared by forming a layer of the resin composition of this invention in a thickness of 0.1 to several millimeters on a metal plate such as iron, stainless steel, zinc or aluminum, a sheet of natural or synthetic rubber, or a polymeric film such as celluloid, polyethylene, polypropylene, polyvinyl chloride, polyethylene terephthalate or polyamide.

If desired, the above layer is adhered to the support through an adhesive layer. Then, a negative film bearing a transparent image is placed on the above layer, and light of wavelengths 200 to 700 mμ is irradiated through the negative film to cure the resin composition.

Usually, exposure is performed for from 1 to about 20 minutes, to provide a very tough cured resin layer. The unexposed non-image areas are then washed out with an aqueous solvent. Suitable aqueous solvents are dilute aqueous solutions of sodium hydroxide, potassium hydroxide, sodium carbonate, sodium bicarbonate, potassium carbonate, potassium bicarbonate, ammonia and diethanolamine. Usually washing for several minutes can result in washing out the uncured areas.

The cured material having reliefs can be used for printing by mounting on a printing press.

When the photocurable resin composition of this invention is cured by light, the resulting cured resin has high toughness and superior flexibility. Therefore, the mounting and dismounting of the printing plate or rough handling of it does not result in damages such as cracking. Furthermore, changes in properties caused by temperature and humidity are reduced, in comparison with the conventional unsaturated polyester compositions, and therefore, the state of printing is affected to a lesser degree by changes in working environment, and printed matter of constant quality can always be provided. These resins further have good deformation recovery, and superior resistance to swelling with organic solvents such as gasoline, an acetic acid ester, and alcohol, acetone, benzene or toluene. Accordingly, such a resin composition of the present invention is very suitable as a material for making printing plates.

The resin composition of this invention also finds applications as paints, adhesives, displays, lenses, and photo-resists.

The following Examples illustrate the present invention in greater detail without any intention of limiting it. In the Examples, all parts are by weight.

The rate of flex, strength, elongation and Young's modulus shown shown in the Examples were measured by the following methods.

Preparation of Test Pieces

The resin composition was cured by means of a machine for making a photosensitive resin plate (KJ-S type plate-making machine, the product of Teijin Limited), and dumbbell-shaped test pieces each having a width of 5.0 mm, a length of 22.5 mm and a thickness of 0.70 mm were prepared.

Measurement of Strength, Elongation and Young's Modulus

Using an Instron tensile tester, the strength, elongation and Young's modulus of the test pieces were measured at a tensile speed of 1 cm/min. The length of each sample was 22.5 mm.

Measurement of Rate of Flex

The rate of flex of the test piece was measured by means of an Instron tensile tester. The test piece was held at two points spaced from each other by a distance of 20 mm, and a weight was exerted on the central portion at a speed of 1 cm per minute, and the rate of flex was determined on the basis of the extent of distortion of the test piece.

EXAMPLE 1

132 Parts of fumaric acid, 83.2 parts of adipic acid, 181 parts of diethylene glycol, and 39.9 parts of trimellitic anhydride were heated to 200° C. in a stream of nitrogen to form an unsaturated polyester having an acid value of 120.

A photocurable resin composition was obtained by mixing 61 parts of the resulting unsaturated polyester, 7 parts of methacrylamide, 4 parts of tetraethylene glycol diacrylate, 12 parts of polyethylene glycol having a molecular weight of 400, 16 parts of butoxyethyl methacrylate, 1 part of benzoin methyl and 0.01 part of p-methoxyphenol.

The photocurable resin composition was coated in a thickness of about 0.7 mm on a polyester film containing an adhesive layer and an antihalation layer, and exposed to ultraviolet light through a negative film bearing a transparent image. The uncured areas were washed out with a 0.2% aqueous solution of sodium carbonate to form relief images with 120 line reliefs per inch. The relef images were very tough, and exhibited strong resistance in a bending test. When tested at 20° C. and at a relative humidity of 60%, the relief images had the following properties.
Strength . . . 1.35 Kg/mm$^2$ Elongation ... 72%
Young's modulus ... 7.3 Kg/mm$^2$
Rate of Flex ... 0.121 mm/mm.

Printing was performed using the relief printing plate obtained above. Good printing could be carried out even at the highlight portion at the center of the solid.

On the other hand, a relief printing plate was prepared in the same manner as above except that all the butoxyethyl methacrylate used above was replaced by tetraethylene glycol diacrylate. When printing was performed using this printing plate, the halftone dots of the highlight portion were not printed at the highlight portion at the center of the solid.

EXAMPLE 2

A photocurable resin composition was prepared by mixing 57 parts of the unsaturated polyester resin obtained in Example 1, 8 parts of acrylamide, 17 parts of tetraethylene glycol dimethacrylate, 18 parts of diethylene glycol monoethyl ether methacrylate, 1.3 parts of benzoin methyl ether and 0.01 part of hydroquinone. For comparison, a resin composition was prepared in the same way as above except that all the diethylene glycol monoethyl ether methacrylate was replaced by tetraethylene glycol dimethacrylate.

Each of these compositions was exposed to the irradiation of ultraviolet rays, and the properties of these resins were compared. The results are tabulated below.

|  | Humidity | Strength (Kg/mm$^2$) | Elongation (%) | Young's modulus (Kg/mm$^2$) | Rate of flex (mm/mm) |
| --- | --- | --- | --- | --- | --- |
| Example 2 | 0 | 1.86 | 62.4 | 27.0 | 0.112 |
|  | 35 | 1.41 | 63.0 | 11.5 | 0.129 |
|  | 80 | 1.05 | 65.0 | 3.9 | 0.135 |
| Comparison | 0 | 2.05 | 19.9 | 41.0 | 0.056 |
|  | 35 | 1.68 | 22.3 | 19.5 | 0.079 |
|  | 80 | 0.86 | 28.0 | 1.5 | 0.095 |

The cured resin composition in Example 2 had good elongation and superior flexibility even at a low humidity, but the cured resin composition in the comparison was very brittle at a low humidity. Furthermore, as is seen from the above results, the cured resin composition in Example 2 changed little in properties with changes in humidity.

EXAMPLE 3

Fumaric acid (5 mols), 5 mols of adipic acid, 9 mols of diethylene glycol and 1 mol of propylene glycol were heated to 200° C. in a stream of nitrogen in the presence, as a catalyst, of p-toluenesulfonic acid, to form an unsaturated polyester having an acid value of 21.

65 Parts of this unsaturated polyester, 4 parts of acrylamide, 4 parts of diacetone acrylamide, 15 parts of triethylene glycol dimethacrylate, 12 parts of diethylene glycol monobutyl ether methacrylate, 1 part of benzoin ethyl ether and 0.01 part of methoxyphenol were mixed to form a photocurable resin composition having the properties shown in the following table.

A relief image was produced in the same way as in Example 1 using the resulting photocurable resin composition. In this case, a 0.2% aqueous solution of sodium hydroxide was used to wash out the unexposed portion. Printing was performed using the resulting relief image. There was obtained clear printed matter with good reproducibility.

For comparison, a relief image was produced in the same manner as above except using a photocurable resin composition prepared from 35 parts of the above unsaturated polyester, 4 parts of acrylamide, 4 parts of diacetone acrylamide, 55 parts of diethylene glycol monobutyl ether methacrylate, 1 part of benzoin ethyl ether and 0.01 part of methoxy phenol. The relief image was too soft, and when printing was performed using this relief image, the line-relief portions were printed in slightly thicker lines. The photocurable resin composition used in the comparison had the properties tabulated below.

|  | Strength (Kg/mm$^2$) | Elongation (%) | Young's modulus (Kg/mm$^2$) |
| --- | --- | --- | --- |
| Example 3 | 1.29 | 67 | 6.5 |
| Comparison | 0.69 | 59 | 3.1 |

Note:
All of the above properties were measured at 20° C. and a relative humidity of 60%.

EXAMPLE 4

A photocurable resin composition was prepared by mixing 57 parts of the unsaturated polyester synthesized in Example 1, 8 parts of acrylamide, 12 parts of tetraethylene glycol diacrylate, 8 parts of diacrylate of polyethylene glycol having a molecular weight of 400, 15 parts of ethoxyethyl methacrylate, 0.2 part of anthraquinone and 0.01 part of hydroquinone.

A relief image was prepared in the same way as in Example 1 using this resin composition. When printing was performed using this relief image, clear printed copies were always obtained.

For comparison, a photocurable resin composition was prepared in the same way as above except that 9 parts of tetraethylene glycol diacrylate and 6 parts of diacrylate of polyethylene glycol having a molecular weight of 400 were used instead of 15 parts of the ethoxyethyl methacrylate used above.

A relief printing plate was prepared in the same way as in Example 1 using this photocurable resin composition, and printing was performed using this printing plate. When the indoor atmosphere was at a temperature below 20° C., the resin became too hard, and separated from the polyester film base, making it impossible to perform printing.

The properties of the cured resins after exposure to ultraviolet rays were measured at a relative humidity of 60%. The results are shown in the following table.

|  | Temperature (°C.) | Strength (Kg/mm$^2$) | Elongation (%) | Young's modulus (Kg/mm$^2$) | Rate of flex (mm/mm) |
| --- | --- | --- | --- | --- | --- |
| Example 4 | 35 | 1.30 | 63 | 1.6 | 0.141 |
|  | 20 | 1.51 | 59 | 4.3 | 0.123 |
|  | 5 | 2.02 | 39 | 8.4 | 0.100 |
| Comparison | 35 | 1.69 | 53 | 2.0 | 0.139 |
|  | 20 | 2.34 | 34 | 7.1 | 0.100 |
|  | 5 | 4.69 | 17 | 20.3 | 0.067 |

The cured resin in Example 4 changed little in strength, elongation and Young's modulus with changes in temperature, and especially, even at 5° C., it showed softness fully suitable for use as a film.

EXAMPLE 5

Fumaric acid (132 parts), 83.2 parts of adipic acid, 39.9 parts of trimellitic anhydride and 181 parts of diethylene glycol were heated to 200° C. in a stream of nitrogen to form an unsaturated polyester having an acid value of 120.

A photocurable resin composition was prepared from 61 parts of the resulting unsaturated polyester, 7 parts of methacrylamide, 8 parts of tetraethylene glycol diacrylate, 8 parts of diacrylate of polyethylene glycol having a molecular weight of 400, 16 parts of acetate of 2-hydroxyethyl methacrylate, 1 part of benzoin methyl ether and 0.01 part of p-methoxyphenol. The photocurable resin was coated in a thickness of about 0.7 mm of a polyester film having an adhesive layer and an antihalation layer, and exposed to ultraviolet rays through a negative film bearing a transparent image. After exposure, the uncured portion was washed out with a 0.2% aqueous solution of sodium carbonate to form a relief printing plate having good reliefs.

When printing was performed using this printing plate, printed copies of sharp contrast were obtained.

This printing plate was flexible, and was not broken at the time of mounting or dismounting it on or from a printing press. Thus, it lent itself to easy handling.

After curing, the photocured composition had the properties shown below (measured at 20° C., and 60% relative humidity).

Strength . . . 1.53 Kg/mm$^2$
Elongation . . . 68%
Young's modulus . . . 3.5 Kg/mm$^2$
Rate of flex . . . 0.120 mm/mm.

EXAMPLE 6

A photocurable resin composition was prepared by mixing 61 parts of the unsaturated polyester prepared in Example 5, 6 parts of methacrylamide, 5 parts of tetraethylene glycol diacrylate, 12 parts of polyethylene glycol diacrylate having a molecular weight of 400, 16 parts of acetate of 2-hydroxyethyl methacrylate, 1.3 parts of benzoin ethyl ether and 0.01 part of p-methoxyphenol.

For comparison, a resin composition was prepared in the same way as above except that 16 parts of the acetate of 2-hydroxyethyl methacrylate used above was replaced by tetramethylene glycol dimethacrylate.

Each of the above resin compositions was exposed to ultraviolet rays, and the properties of the cured resins were measured at 20° C. and a relative humidity of 60%. The results are shown below.

| Property | Example 6 | Comparison |
|---|---|---|
| Strength (Kg/mm$^2$) | 1.94 | 2.37 |
| Elongation (%) | 53 | 18 |
| Young's modulus (Kg/mm$^2$) | 25.0 | 51.7 |
| Rate of flex (mm/mm) | 0.101 | 0.076 |

It is seen from the above that the cured resin obtained in Example 6 had superior flexibility.

A relief printing plate was prepared in the same way as in Example 5 using the resin composition of Example 6. The printing plate was soft and easy to handle, and gave clear printed copies.

EXAMPLE 7

Fumaric acid (5 mols), 5 mols of adipic acid, 9 mols of diethylene glycol and 1 mol of propylene glycol were heated to 200° C. in a stream of nitrogen in the presence, as a catalyst, of p-toluenesulfonic acid to form an unsaturated polyester having an acid value of 21.

A photocurable resin composition was prepared from 65 parts of the unsaturated polyester, 4 parts of acrylamide, 4 parts of diacetone acrylamide, 15 parts of triethylene glycol dimethacrylate, 12 parts of diethylene glycol monomethacrylate acetate, 1 part of benzoin ethyl ether and 0.01 part of methoxy phenol.

Using this photocurable resin composition, a relief image was prepared in the same way as in Example 1. In this case, a 0.2% aqueous solution of sodium hydroxide was used to wash out the unexposed portion. When printing was performed using this relief image, clear printed copies of good reproducibility were obtained.

For comparison, a photocurable resin composition was prepared from 35 parts of the unsaturated polyester obtained above, 4 parts of acrylamide, 4 parts of diacetone acrylamide, 55 parts of diethylene glycol monobutyl ether methacrylate, 1 part of benzoin ethyl ether and 0.01 part of methoxy phenol. Using this composition, a relief image was produced in the same way as above. This relief image was too soft, and when printing was performed using this relief image, the line-relief portions were printed in somewhat thicker lines.

The properties of each of the photocurable resin compositions were measured at a temperature of 20° C. and a relative humidity of 60% after exposure to ultraviolet rays. The results are shown in the following table.

| Property | Example 7 | Comparison |
|---|---|---|
| Strength (Kg/mm$^2$) | 1.09 | 0.63 |
| Elongation (%) | 61 | 49 |
| Young's modulus (Kg/mm$^2$) | 4.3 | 1.7 |
| Rate of flex (mm/mm) | 0.121 | 0.105 |

EXAMPLE 8

A photocurable resin composition was prepared from 57 parts of the unsaturated polyester synthesized in Example 5, 8 parts of acrylamide, 12 parts of tetraethylene glycol diacrylate, 8 parts of diacrylate of polyethylene glycol having a molecular weight of 400, 15 parts of acetate of 2-hydroxyethyl acrylate, 0.2 part of anthraquinone and 0.01 part of hydroquinone. A relief printing plate was prepared in the same way as in Example 5 using this resin composition, and printing was performed using the relief printing plate obtained. Very clear printed copies were obtained.

For comparison, a photocurable resin composition was prepared in the same manner as above except that 9 parts of tetraethylene glycol diacrylate and 6 parts of diacrylate of polyethylene glycol having a molecular weight of 400 were used instead of 15 parts of the acetate of 2-hydroxyethyl acrylate used above. A relief printing plate was prepared in the same manner as in Example 5 using this photocurable resin composition, and printing was performed using this resin composition. When the temperature of the indoor atmosphere was low, the relief mounted on a rotary press partly separated from the base film, and printing could not be performed in normal condition.

The properties of each of these resin compositions were measured at a relative humidity of 60% after exposure to ultraviolet rays. The results are shown in the following table.

|  | Temperature (°C.) | Strength (Kg/mm²) | Elongation (%) | Young's modulus (Kg/mm²) | Rate of flex (mm/mm) |
| --- | --- | --- | --- | --- | --- |
| Example 8 | 35 | 1.24 | 69 | 1.9 | 0.131 |
|  | 20 | 1.69 | 57 | 5.6 | 0.116 |
|  | 5 | 1.95 | 41 | 14.3 | 0.095 |
| Comparison | 35 | 1.37 | 47 | 2.0 | 0.141 |
|  | 20 | 2.28 | 34 | 7.1 | 0.089 |
|  | 5 | 5.01 | 19 | 20.3 | 0.069 |

As shown in the above table, the resin composition obtained in Example 8 changed little in Young's modulus with changes in temperature, and even at 5° C., exhibited softness sufficiently usable for the film.

EXAMPLE 9

A photocurable resin composition was prepared by mixing 61 parts of the unsaturated polyester obtained in Example 1, 7 parts of methacrylamide, 4.5 parts of tetraethylene glycol diacrylate, 11 parts of diacrylate of polyethylene glycol having a molecular weight of 400, 16.5 parts of phenoxyethylmethacrylate, 1 part of benzoin methyl ether and 0.01 part of p-methoxy phenol. A relief image was prepared in the same manner as in Example 1 using this resin composition. In this case, a 0.5% aqueous solution of sodium carbonate was used to wash out the uncured portion. When printing was performed using this relief image, clear printed copies with good reproducibility were obtained.

The properties of the above photocurable compositions were measured at a temperature of 20° C. and a relative humidity of 60% after exposure to ultraviolet rays. The results were as follows:
Strength ... 1.67 Kg/mm²
Elongation ... 65%
Young's modulus ... 5.9 Kg/mm²

The above cured resin was very flexible, and had good toughness.

EXAMPLE 10

A photocurable resin composition was prepared by mixing 58 parts of the unsaturated polyester prepared in Example 5, 9 parts of acrylamide, 8 parts of tetraethylene glycol diacrylate, 8 parts of diacrylate of polyethylene glycol having a molecular weight of 400, 18 parts of acetate of 3-chloro-2-hydroxypropyl methacrylate, 1 part of benzoin methyl ether and 0.01 part of p-methoxy phenol. A relief image was prepared in the same way as in Example 5 using this photocurable resin composition.

This relief printing plate had very good flexibility and when this plate was mounted on a rotary press of small diameter and printing was performed, no trouble occurred. There were obtained printed copies having sharp images and lines.

The printing plate was not injured when removed from the printing press.

The cured resin had the following properties (measured at 20° C. and 60% RH).
Strength ... 101 Kg/mm²
Elongation ... 61%
Young's modulus ... 2.8 Kg/mm²
Rate of flex ... 1.021 mm/mm.

As a showing that the embodiment of this invention in which the cross-linking agent is composed of three components—(a) an acrylamide or methacrylamide type compound, (b) an acrylate or methacrylate type compound, and (c) a compound of formula (1)—is superior to a cross-linking agent lacking any one of these components, the following examples were prepared.

EXAMPLE 11

Fumaric acid (132 parts), 83.2 parts of adipic acid, 39.9 parts of trimellitic anhydride and 181 parts of diethylene glycol were heated to 200° C. in a stream of nitrogen, to form an unsaturated polyester having an acid value of 120.

By use of the resulting unsaturated polyester, four types of photocurable resin compositions of the formulations shown in Table 11-a were prepared which were referred to as resin 11-A, resin 11-B, resin 11-C and resin 11-D.

Table 11-a

|  | Resin composition (parts by weight) | | | |
| --- | --- | --- | --- | --- |
|  | 11-A | 11-B | 11-C | 11-D |
| Unsaturated polyester | 61 | 61 | 61 | 61 |
| Methacrylamide | 7 | 7 | 7 | 0 |
| Acetoxyethyl methacrylate | 16 | 0 | 32 | 16 |
| Tetraethylene glycol diacrylate | 8 | 24 | 0 | 8 |
| Nonaethylene glycol diacrylate | 8 | 8 | 0 | 15 |
| Benzoin methyl ether | 1 | 1 | 1 | 1 |
| Methoquinone | 0.01 | 0.01 | 0.01 | 0.01 |

The strength, elongation and Young's modulus of each resin composition shown in Table 11-a were tested in the following manner:

Preparation of Test Pieces

The resin composition was cured by means of a machine for making a photosensitive resin plate (KJ-S type plate-making machine equipped with eight 60-W fluorescent tubes, the product of Teijin Limited), and dumbbell-shaped test pieces each having a width of 5.0 mm, a length of 22.5 mm and a thickness of 0.70 mm were prepared.

Measurement of Strength, Elongation and Young's Modulus

Using an Instron tensile tester, the strength, elongation and Young's modulus of the test pieces were measured at a tensile speed of 1 cm/min. The length of each sample was 22.5 mm. The results are shown in Table 11-b.

Table 11-b

|  | Resin Composition | | | |
| --- | --- | --- | --- | --- |
|  | 11-A | 11-B | 11-C | 11-D |
| Strength (Kg/mm²) | 1.78 | 2.30 | 0.66 | 0.23 |
| Elongation (%) | 69 | 25 | 37 | 31 |
| Young's modulus (Kg/mm²) | 7.9 | 28.0 | 4.8 | 1.2 |

Note:
Measured at a temperature of 20° C. and at a relative humidity of 35%.

EXAMPLE 12

An unsaturated polyester having an acid value of 120 was formed in the same way as in Example 11 except that 580 parts by weight of fumaric acid, 584 parts by weight of adipic acid, 192 parts by weight of trimellitic anhydride, and 954 parts by weight of diethylene glycol were used.

Using the unsaturated polyester, four types of resin compositions, designated as 12-A, 12-B, 12-C and 12-D, having the formulations shown in Table 12-a were prepared.

Table 12-a

|  | Resin Composition (parts by weight) | | | |
| --- | --- | --- | --- | --- |
|  | 12-A | 12-B | 12-C | 12-D |
| Unsaturated polyester | 57 | 57 | 57 | 57 |
| Methacrylamide | 6 | 6 | 6 | 6 |
| Propionyloxyethyl methacrylate | 16 | 0 | 37 | 16 |
| Tetraethylene glycol dimethacrylate | 7 | 23 | 0 | 7 |
| Nonaethylene glycol dimethacrylate | 14 | 14 | 0 | 20 |
| Benzoin ethyl ether | 1.0 | 1.0 | 1.0 | 1.0 |
| Methoquinone | 0.01 | 0.01 | 0.01 | 0.01 |

Each of these resin compositions was tested in the same manner as in Example 11 to obtain the results shown in Table 12-b.

Table 12-b

|  | Resin Composition | | | |
| --- | --- | --- | --- | --- |
|  | 12-A | 12-B | 12-C | 12-D |
| Strength (Kg/mm$^2$) | 1.55 | 2.22 | 0.63 | 0.27 |
| Elongation (%) | 62 | 28 | 40 | 37 |
| Young's modulus (Kg/mm$^2$) | 8.2 | 23.0 | 4.3 | 1.7 |

EXAMPLE 13

Using the same unsaturated polyester as used in Example 12, four types of resin compositions, 13-A, 13-B, 13-C and 13-D, having the formulations shown in Table 13-a were prepared.

Table 13-a

|  | Resin composition (parts by weight) | | | |
| --- | --- | --- | --- | --- |
|  | 13-A | 13-B | 13-C | 13-D |
| Unsaturated polyester | 56 | 56 | 56 | 56 |
| Methacrylamide | 4 | 4 | 4 | 0 |
| Diacetone acrylamide | 4 | 4 | 4 | 0 |
| Benzoyloxyethyl methacrylate | 15 | 0 | 36 | 15 |
| Tetraethylene glycol dimethacrylate | 9 | 24 | 0 | 9 |
| Nonaethylene glycol diacrylate | 12 | 12 | 0 | 20 |
| Benzoin ethyl ether | 0.7 | 0.7 | 0.7 | 0.7 |
| Methoquinone | 0.01 | 0.01 | 0.01 | 0.01 |

The same tests as in Example 11 were conducted on each of these resin compositions to obtain the results shown in Table 13-b.

Table 13-b

|  | Resin Compositions | | | |
| --- | --- | --- | --- | --- |
|  | 13-A | 13-B | 13-C | 13-D |
| Strength (Kg/mm$^2$) | 1.42 | 1.96 | 0.51 | 0.21 |
| Elongation (%) | 61 | 26 | 53 | 23 |
| Young's modulus (Kg/mm$^2$) | 7.9 | 22.3 | 3.6 | 1.3 |

EXAMPLE 14

The same unsaturated polyester as used in Example 11 was employed to prepared four types of resin compositions, 14-A, 14-B, 14-C and 14-D, having the formulations shown in Table 14-a.

Table 14-a

|  | Resin composition (parts by weight) | | | |
| --- | --- | --- | --- | --- |
|  | 14-A | 14-B | 14-C | 14-D |
| Unsaturated polyester | 57 | 57 | 57 | 57 |
| Acrylamide | 8 | 8 | 8 | 0 |
| Butyryloxyethyl methacrylate | 18 | 0 | 32 | 18 |
| Tetraethylene glycol diacrylate | 17 | 35 | 0 | 17 |
| Benzoin ethyl ether | 1.3 | 1.3 | 1.3 | 1.3 |
| Hydroquinone | 0.01 | 0.01 | 0.01 | 0.01 |

Each of these resin compositions was tested in the same manner as in Example 11 to obtain the results shown in Table 14-b.

Table 14-b

|  | Resin composition | | | |
| --- | --- | --- | --- | --- |
|  | 14-A | 14-B | 14-C | 14-D |
| Strength (Kg/mm$^2$) | 1.53 | 1.68 | 0.53 | 0.19 |
| Elongation (%) | 68 | 22.3 | 42 | 21 |
| Young's modulus (Kg/mm$^2$) | 10.3 | 19.5 | 4.8 | 1.1 |

EXAMPLE 15

An unsaturated polyester having an acid value of 30 was formed in the same manner as in Example 11 except that 444 parts by weight of phthalic anhydride, 294 parts by weight of maleic anhydride and 516.8 parts by weight of propylene glycol were used.

Using this unsaturated polyester, four types of resin compositions, 15-A, 15-B, 15-C and 15-D, having the formulations shown in Table 15-a were prepared.

Table 15-a

|  | Resin composition (parts by weight) | | | |
| --- | --- | --- | --- | --- |
|  | 15-A | 15-B | 15-C | 15-D |
| Unsaturated polyester | 60 | 60 | 60 | 60 |
| Methacrylamide | 4 | 4 | 4 | 0 |
| α-Chloroacetoxyethyl acrylate | 12 | 0 | 36 | 12 |
| Tetraethylene glycd dimethacrylate | 8 | 20 | 0 | 8 |
| Nonaethylene glycol dimethacrylate | 16 | 16 | 0 | 20 |
| Benzoin methyl ether | 1.0 | 1.0 | 1.0 | 1.0 |
| Hydroquinone | 0.01 | 0.01 | 0.01 | 0.01 |

In connection with each of these compositions, the same tests as in Example 11 were performed to obtain the results shown in Table 15-b.

Table 15-b

|  | Resin Composition | | | |
| --- | --- | --- | --- | --- |
|  | 15-A | 15-B | 15-C | 15-D |
| Strength (Kg/mm$^2$) | 1.67 | 1.98 | 0.67 | 0.26 |
| Elongation (%) | 57 | 18 | 31 | 28 |
| Young's modulus (Kg/mm$^2$) | 12.3 | 26.3 | 6.3 | 1.8 |

EXAMPLE 16

The same unsaturated polyester as used in Example 11 was used to prepare four types of resin compositions, 16-A, 16-B, 16-C and 16-D, having the formulations as shown in Table 16-a.

Table 16-a

|  | REsin composition Resin by weight) | | | |
| --- | --- | --- | --- | --- |
|  | 16-A | 16-B | 16-C | 16-D |
| Unsaturated polyester | 57 | 57 | 57 | 57 |

Table 16-a-continued

|  | REsin composition Resin by weight) | | | |
| --- | --- | --- | --- | --- |
|  | 16-A | 16-B | 16-C | 16-D |
| Acrylamide | 8 | 8 | 8 | 0 |
| Diethylene glycol mono-ethyl ether methacrylate | 18 | 0 | 35 | 26 |
| Tetraethylene glycol dimethacrylate | 17 | 35 | 0 | 17 |
| Benzoin ethyl ether | 1.3 | 1.3 | 1.3 | 1.3 |
| Hydroquinone | 0.01 | 0.01 | 0.01 | 0.01 |

The same tests as in Example 11 were applied to each of these compositions to obtain the results shown in Table 16-b.

Table 16-b

|  | Resin composition | | | |
| --- | --- | --- | --- | --- |
|  | 16-A | 16-B | 16-C | 16-D |
| Strength (Kg/mm$^2$) | 1.41 | 2.31 | 0.43 | 0.18 |
| Elongation (%) | 63.0 | 19.0 | 31.0 | 21.0 |
| Young's modulus | 11.5 | 37.0 | 2.3 | 1.1 |

EXAMPLE 17

The same unsaturated polyester as in Example 11 was used to prepare four types of resin compositions, 17-A, 17-B, 17-C and 17-D, of the formulations shown in Table 17-a.

Table 17-a

|  | Resin composition (parts by weight) | | | |
| --- | --- | --- | --- | --- |
|  | 17-A | 17-B | 17-C | 17-D |
| Unsaturated polyester | 61 | 61 | 61 | 61 |
| Methacrylamide | 7 | 7 | 7 | 0 |
| Phenoxyethyl methacrylate | 16.5 | 0 | 32 | 16.5 |
| Tetraethylene glycol diacrylate | 4.5 | 21.0 | 0 | 4.5 |
| Nonaethylene glycol diacrylate | 11 | 11 | 0 | 18 |
| Benzoin methyl ether | 1.0 | 1.0 | 1.0 | 1.0 |
| Methoquinone | 0.01 | 0.01 | 0.01 | 0.01 |

Each of these compositions was tested in the same manner as in Example 11 except that measurements were performed at 20° C. and at a relative humidity of 60%. The results are shown in Table 17-b.

Table 17-b

|  | Resin compositions | | | |
| --- | --- | --- | --- | --- |
|  | 17-A | 17-B | 17-C | 17-D |
| Strength (kg/mm$^2$) | 1.67 | 1.93 | 0.54 | 0.17 |
| Elongation (%) | 65 | 23 | 36 | 18 |
| Young's modulus (Kg/mm$^2$) | 5.9 | 26.0 | 3.1 | 0.9 |

From Examples 11 through 17 it can be concluded that:

(1) A resin composition of type A (the three component embodiment) has good toughness and exhibits superior strength and elongation.

(2) A resin composition of type B is suitable for a printing plate having a metal base, but has small elongation, and because of high brittleness, is unsuitable for a printing plate having a film base.

(3) Resin compositions of type C and type D are both insufficient in strength and in sensitivity as well.

(4) Comparison between a resin composition of type A and a resin composition of type B in Examples 11, 12, 13, 14 and 15 shows that a compound containing a saturated acyl group as $R^3$ is superior to a compound containing an unsaturated acyl group as $R^3$.

The following two examples demonstrate that a compound of formula (1) in which $R^3$ is a saturated acyl group is superior to one in which $R^3$ is an unsaturated acyl group:

EXAMPLE 18

A photocurable resin composition was prepared by mixing 61 parts by weight of the unsaturated polyester prepared in Example 11, 6 parts by weight of methacrylamide, 5 parts by weight of tetraethylene glycol diacrylate, 12 parts by weight of polyethylene glycol diacrylate having a molecular weight of 400, 16 parts by weight of acetate of 2-hydroxyethyl methacrylate, 1.3 parts by weight of benzoin ethyl ether and 0.01 part by weight of p-methoxyphenol.

For comparison, a resin composition was prepared in the same way as above except that 16 parts by weight of the acetate of 2-hydroxyethyl methacrylate used above was replaced by tetramethylene glycol dimethacrylate.

Each of these resin compositions were tested in the same way as in Example 17 (temperature: 20° C., relative humidity: 60%).

The rate of flex of the test piece was also measured by means of an Instron tensile tester. The test piece was held at two points spaced from each other by a distance of 20 mm, and a weight was exerted on the central portion at a speed of 1 cm per minute, and the rate of flex was determined on the basis of the extent of distortion of the test piece.

The results are shown in Table 18.

Table 18

| Property | Example 18 | Comparison |
| --- | --- | --- |
| Strength (Kg/mm$^2$) | 1.94 | 2.37 |
| Elongation (%) | 53 | 18 |
| Young's modulus (Kg/mm$^2$) | 25.0 | 51.7 |
| Rate of flex (mm/mm) | 0.101 | 0.076 |

The above test results show that a compound in which $R^3$ is a saturated acyl group is superior to a compound in which $R^3$ is an unsaturated acyl group.

EXAMPLE 19

A photocurable resin composition was prepared from 57 parts by weight of the unsaturated polyester synthesized in Example 11, 8 parts by weight of acrylamide, 12 parts by weight of tetraethylene glycol diacrylate, 8 parts by weight of diacrylate of polyethylene glycol having a molecular weight of 400, 15 parts by weight of acetate of 2-hydroxyethyl acrylate, 0.2 part by weight of anthraquinone and 0.01 part by weight of hydroquinone. The photocurable resin was coated in a thickness of about 0.7 mm on a polyester film having an adhesive layer and an antihalation layer, and exposed to ultraviolet rays through a negative film bearing a transparent image. After exposure, the uncured portion was washed out with a 0.2% aqueous solution of sodium carbonate to form a relief printing plate and printing was performed using the relief printing plate so obtained. Very clear printed copies were obtained.

For comparison, a photocurable resin composition was prepared in the same manner as above except that 9 parts by weight of tetraethylene glycol diacrylate and 6 parts by weight of diacrylate of polyethylene glycol having a molecular weight of 400 were used instead of 15 parts by weight of the acetate of 2-hydroxyethyl acrylate used above. A relief printing plate was prepared in the same manner as in Example 11 using this photocurable resin composition, and printing was performed using this resin composition. When the temperature of the indoor atmosphere was low, the relief mounted on a rotary press partly separated from the base film, and printing could not be performed in normal condition.

Each of the resin compositions were tested in the same way as in Example 18 to obtain the results shown in Table 19.

Table 19

| | Temperature (°C.) | Strength (Kg/mm²) | Elongation (%) | Young's modulus (Kg/mm²) | Rate of flex (mm/mm) |
|---|---|---|---|---|---|
| Example 19 | 35 | 1.24 | 69 | 1.9 | 0.131 |
| | 20 | 1.69 | 57 | 5.6 | 0.116 |
| | 5 | 1.95 | 41 | 14.3 | 0.095 |
| Comparison | 35 | 1.37 | 47 | 2.0 | 0.141 |
| | 20 | 2.28 | 34 | 7.1 | 0.089 |
| | 5 | 5.01 | 19 | 20.3 | 0.069 |

As shown in the above table, the Young's modulus of the resin composition obtained in Example 19 changes little with temperature, and even at 5° C., the resin composition exhibits softness sufficiently usable for film.

As a showing that this invention is superior to the prior art, the following examples were prepared.

EXAMPLE 20

Fumaric acid (132 parts), 83.2 parts by weight of adipic acid, 39.9 parts by weight of trimellitic anhydride and 181 parts by weight of diethylene glycol were heated to 200° C. in a stream of nitrogen to form an unsaturated polyester having an acid value of 120.

A photosensitive resin was obtained from a mixture of 60 parts of said unsaturated polyester, 8 parts of acrylamide, 17 parts of tetraethylene glycol dimethacrylate, 15 parts of diethylene glycol monoethylether methacrylate, 1 part of benzoin ethylether and 0.01 part of p-methoxyphenol. This is designated as resin 20-A.

For a comparison purpose, a photosensitive resin composition was formed in quite the same manner as above except that 2-hydroxyethyl methacrylate was used instead of diethylene glycol monoethylether methacrylate in the above composition. This is designated as resin 20-B.

For another comparison purpose, a photosensitive resin composition was prepared in quite the same way as above except that hexamethylene maleate having an acid value of 11 was used instead of the unsaturated polyester employed in resin 20-A. This is designated as resin 20-C.

(a) Each of said resins 20-A and 20-B were exposed to an ultraviolet fluorescent tube for 8 minutes, thereby to prepare cured resins having a thickness of 0.7 mm. Successively, there was measured strenth (T.S.), elongation (T.E.) and Young's modulus (Y) of said respective cured resins in a case where they were left to stand at normal temperatures for one week in an atmosphere of humidity of 0% and in a case where they were left to stand at normal temperatures for one week in an atmosphere of humidity of 80%. The results obtained are shown in Table 20.

Table 20

| | Humidity 0% | | | Humidity 80% | | |
|---|---|---|---|---|---|---|
| | T.S. (Kg/cm²) | T.E. (%) | Y (Kg/mm²) | T.S. (Kg/cm²) | T.E. (%) | Y (Kg/mm²) |
| 20-A | 1.73 | 58 | 19.6 | 0.71 | 53 | 2.1 |
| 20-B | 1.85 | 43 | 25.4 | 0.26 | 23 | 0.9 |

Resin 20-A is a photosensitive resin composition of the type using the cross-linking agent of this invention, and resin 20-B, a photosensitive resin of the type using a cross-linking agent obtained by a combination of three kinds of ethylenically unsaturated monomers as shown in U.S. Pat. No. 3,839,171 (Akamatsu, et al.).

It is understood from the above results that resin 20-B using the cross-linking agent of Akamatsu, et al., is inferior to resin 20-A of the present invention in humidity resistance.

(b) Each of resins 20-A, 20-B and 20-C were exposed to light through a negative film bearing an image and the uncured areas were washed out with a 0.5% aqueous solution of sodium carbonate. As a result, the development of resin 20-C was not sufficient.

Resin 20-C is a photosensitive resin composition of the type in which the cross-linking agent of the invention was added to poly(hexamethylene maleate) having an acid value of 11 (Example 1), unsaturated polyester (col. 10, line 47) employed in U.S. Pat. No. 3,759,807 (Osborn, et al.).

The reason why the unsaturated polyester used was selected in resin 20-C is that the unsaturated polyester disclosed in Example 1 was unavailable.

It is understood from the above experimental result that a good printing plate cannot be obtained even by adding the crosslinking agent of the present invention to the unsaturated polyester having an acid value as low as 11.

EXAMPLE 21

An unsaturated polyester having an acid value of 30 was formed in the same manner as in Example 20 except that 444 parts by weight of phthalic anhydride, 294 parts by weight of maleic anhydride and 516.8 parts by weight of propylene glycol were used.

Four photosensitive resin compositions, 21-A, 21-B, 21-C and 21-D, shown in Table 21-a were formed using the resulting unsaturated polyesters.

Table 21-a

| | Resin compositions (parts by weight) | | | |
|---|---|---|---|---|
| | 21-A | 21-B | 21-C | 21-D |
| Unsaturated polyester | 63 | 63 | 63 | 63 |
| Acrylamide | 8 | 0 | 0 | 0 |
| Phenoxyethyl acrylate | 15 | 23 | 37 | 0 |
| Tetraethylene glycol dimethacrylate | 14 | 14 | 0 | 0 |
| Styrene | 0 | 0 | 0 | 37 |

Each resin contains 1 wt.% of a sensitizer benzoin methylether and 60 ppm of hydroquinone.

Measurements were taken of the strength, elongation, Young's modulus and rate of flex (F) of the respective resins. The results obtained are shown in Table 21-b.

Table 21-b

| Resin | T.S. (Kg/cm²) | T.E. (%) | Y (Kg/mm²) | F (min/mm) |
|---|---|---|---|---|
| 21-A | 1.63 | 51 | 14.3 | 0.125 |
| 21-B | 0.31 | 25 | 1.8 | — |

Table 21-b-continued

| Resin | T.S. (Kg/cm²) | T.E. (%) | Y (Kg/mm²) | F (min/mm) |
|---|---|---|---|---|
| 21-C | 0.35 | 22 | 1.9 | — |
| 21-D | 2.70 | 18 | 93.0 | 0.085 |

Resin 21-D is a photosensitive resin composition corresponding to Example 9 of U.S. Pat. No. 3,827,959 (McGinnis). Resin 21-A is the photosensitive resin composition of the present invention in which the cross-linking agent of the invention was added to the same unsaturated polyester as that used in resin 21-D.

It is understood from a comparison of resins 21-A and 21-D shown in Table 21-b that the photosensitive resin of the present invention has a superior flexibility after curing to that of the product shown in the McGinnis patent.

Additionally, resin 21-B is a control photosensitive resin free from component (I) in the cross-linking agent of the present invention, i.e. an acrylamide type compound. Resin 21-D is a control photosensitive resin free from components (1) and (3) in the crosslinking agent of the present invention.

It is understood from the results in Table 21-b that the photosensitive resin of the present invention has superior physical properties to those of the Control.

What is claimed is:

1. In photosensitive resin composition consisting essentially of: an unsaturated polyester having an acid value of at least 20 and present in from 0.01 to 10% by weight based on the weight of the entire composition; a cross-linking agent; and a photosensitizer; the improvement comprising:

a cross-linking agent present in from 5 to 70% by weight based on the weight of the entire composition and consisting essentially of the combination of (1) a polyacrylate or polymethacrylate compound, (2) an acrylamide or methacrylamide compound present in from 1 to 20% by weight based on the weight of the entire composition of the formula

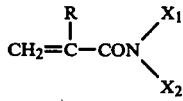

wherein R is hydrogen or alkyl and $X_1$ and $X_2$ are organic groups, and (3) a compound present in from 0.5 to 40% by weight based on the weight of the entire composition and not more than 80% by weight based on the total weight of the cross-linking agent of the formula

wherein n is an integer of at least 1, p, q, and r are 0 or an integer of at least 1, with the proviso that p+q+r equals from 2 to 6, $R^1$ is hydrogen or methyl, $R^2$ is lower alkyl optionally substituted with a halogen, and $R^3$ is alkyl, aryl or saturated acyl optionally substituted with a halogen.

2. The improved composition of claim 1 wherein the acid value of the unsaturated polyester is at least 50.

3. The improved composition of claim 1 wherein said compound (3) is present in from 0.5 to 30% by weight based on the weight of the entire composition and from 10 to 70% by weight based on the weight of the cross-linking agent, and wherein said compound (2) is present in from 3 to 12% by weight on the weight of the entire composition.

4. The improved composition of claim 1 with the addition of a heat polymerization inhibitor present in an amount of 0.0001 to 5% by weight based on the weight of the entire composition and selected from the group consisting of phenols, hydroquinones, catechols, or picric acids.

5. The improved composition of claim 1 wherein compound (2) is selected from the group consisting of acrylamide, diacetone acrylamide, and methacrylamide, compound (1) is selected from the group consisting of tetraethylene glycol diacrylate, polyethylene glycol diacrylate, tetraethylene glycol dimethacrylate, and and triethylene glycol dimethacrylate, and compound (3) is selected from the group consisting of butoxyethyl methacrylate, diethylene glycol monoethyl ether methacrylate, diethylene glycol monobutyl ether methacrylate, ethoxyethyl methacrylate, 2-hydroxyethyl methacrylate acetate, diethylene glycol monomethacrylate acetate, phenoxyethyl methacrylate, and 3-chloro-2-hydroxypropyl methacrylate acetate.

6. The composition of claim 1 wherein said acrylamide compound is selected from the group consisting of acrylamide, diacetone acrylamide, N-methylol acrylamide, N-ethylol acrylamide, N-butyrol acrylamide, N-methyl acrylamide, N-isopropyl acrylamide, and N,N-dimethyl acrylamide; said methacrylamide compound is selected from the group consisting of methacrylamide, N-methylol acrylamide, N-ethylolacrylamide, N-butyrol acrylamide, N-methyl methacrylamide and N-isopropyl methacrylamide; said polyacrylate compound is selected from the group consisting of diethylene glycol diacrylate, triethylene glycol diacrylate, tetraethylene glycol diacrylate, polyethylene glycol diacrylate, trimethylol propane triacrylate and pentaerythritol triacrylate; and said poly methacrylate compound is selected from the group consisting of diethylene glycol dimethacrylate, triethylene glycol dimethacrylate, tetraethylene glycol dimethacrylate, polyethylene glycol dimethacrylate, dipropylene glycol dimethacrylate, polypropylene glycol dimethacrylate, trimethylol propane trimethacrylate and glycerine trimethacrylate.

7. The composition of claim 1 wherein said compound (2) is at least one compound selected from the group consisting of acrylamide, diacetone acrylamide, and methacrylamide.

8. The composition of claim 1 wherein said compound (1) is at least one compound selected from the group consisting of tetraethylene glycol diacrylate, polyethylene glycol diacrylate, tetraethylene glycol dimethacrylate, and triethylene glycol dimethacrylate.

9. The composition of claim 1 wherein said compound (3) is selected from the group consisting of butoxyethyl methacrylate, diethylene glycol monoethyl ether methacrylate, diethylene glycol monobutyl ether methacrylate, ethoxyethyl methacrylate, 2-hydroxyethyl methacrylate acetate, diethylene glycol monomethacrylate acetate, phenoxyethyl methacrylate, and 3-chloro-2-hydroxypropyl methacrylate acetate.

10. The composition of claim 1 wherein $R^3$ is an alkyl group selected from the group consisting of methyl, ethyl, propyl and butyl, said alkyl group optionally being substituted with a halogen atom.

11. The composition of claim 1 wherein $R^3$ is an aryl group selected from the group consisting of phenyl and naphthyl, wherein said aryl group may be substituted with a halogen atom.

12. The composition of claim 1 wherein $R^3$ is a saturated acyl group selected from the group consisting of acetyl, propionyl, butyryl and benzoyl, wherein said saturated acyl group may be substituted with a halogen atom.

13. The composition of claim 9 wherein said compound (1) is at least one compound selected from the group consisting of tetraethylene glycol diacrylate, polyethylene glycol diacrylate, tetraethylene glycol dimethacrylate, and triethylene glycol dimethacrylate; said compound (2) is at least one compound selected from the group consiting of acrylamide, diacetone acrylamide, and methacrylamide; and said compound (3) has as the $R^3$ moiety in the formula a moiety selected from the group consisting of methyl, ethyl, propyl, butyl, phenyl, naphthyl, acetyl, propionyl, butyryl, benzoyl, and their halogen substitution products.

14. The compound of claim 13 wherein the acid value of the unsaturated polyester is at least 50, and wherein said compound (2) is present in from 3 to 12% and said compound (3) is present in from 10 to 70%, both amounts being by weight based on the weight of the entire composition.

* * * * *

UNITED STATES PATENT AND TRADEMARK OFFICE
CERTIFICATE OF CORRECTION

PATENT NO. : 4,192,685
DATED : March 11, 1980
INVENTOR(S) : Horike, et al.

It is certified that error appears in the above—identified patent and that said Letters Patent is hereby corrected as shown below:

In claim 3, line 6, after "weight" in the first instance, insert -- based --.

Signed and Sealed this

Tenth Day of June 1980

[SEAL]

Attest:

*Attesting Officer*

SIDNEY A. DIAMOND

*Commissioner of Patents and Trademarks*